(12) United States Patent
Tokuhira et al.

(10) Patent No.: US 10,930,660 B2
(45) Date of Patent: *Feb. 23, 2021

(54) SEMICONDUCTOR MEMORY DEVICE AND METHOD FOR MANUFACTURING THE SAME

(71) Applicant: TOSHIBA MEMORY CORPORATION, Minato-ku (JP)

(72) Inventors: Hiroki Tokuhira, Kawasaki (JP); Takahisa Kanemura, Yokohama (JP); Shigeo Kondo, Yokkaichi (JP); Michiru Hogyoku, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/793,359

(22) Filed: Feb. 18, 2020

(65) Prior Publication Data

US 2020/0185395 A1 Jun. 11, 2020

Related U.S. Application Data

(63) Continuation of application No. 16/511,111, filed on Jul. 15, 2019, now Pat. No. 10,608,007, which is a
(Continued)

(51) Int. Cl.
| | | |
|---|---|---|
| *H01L 27/1157* | (2017.01) | |
| *H01L 21/28* | (2006.01) | |
| *H01L 27/11582* | (2017.01) | |

(52) U.S. Cl.
CPC .... *H01L 27/1157* (2013.01); *H01L 27/11582* (2013.01); *H01L 29/40117* (2019.08)

(58) Field of Classification Search
None
See application file for complete search history.

(56) References Cited

U.S. PATENT DOCUMENTS

| | | |
|---|---|---|
| 2009/0146206 A1 | 6/2009 | Fukuzumi et al. |
| 2010/0109072 A1 | 5/2010 | Kidoh et al. |

(Continued)

FOREIGN PATENT DOCUMENTS

| | | |
|---|---|---|
| JP | 2007-158139 | 6/2007 |
| JP | 4468433 | 5/2010 |

(Continued)

*Primary Examiner* — Mounir S Amer
(74) *Attorney, Agent, or Firm* — Oblon, McClelland, Maier & Neustadt, L.L.P.

(57) ABSTRACT

A semiconductor memory device according to an embodiment includes a first stacked body, a second stacked body, an intermediate conductive layer, an intermediate insulating layer, a semiconductor pillar, a charge storage film, and an insulating film. The semiconductor pillar includes a first part, a second part, and a third part. The charge storage film includes a first charge storage portion and a second charge storage portion. The charge storage film includes at least one first element selected from the group consisting of nitrogen, hafnium, and aluminum. The insulating film provides in at least a portion between the intermediate conductive layer and the first part. The insulating film not includes the first element, or the insulating film has a concentration of the first element lower than a concentration of the first element of the charge storage film.

20 Claims, 9 Drawing Sheets

Related U.S. Application Data continuation of application No. 15/863,490, filed on Jan. 5, 2018, now Pat. No. 10,431,590, which is a continuation of application No. 15/264,903, filed on Sep. 14, 2016, now Pat. No. 9,985,044.

(60) Provisional application No. 62/306,672, filed on Mar. 11, 2016.

(56) References Cited

U.S. PATENT DOCUMENTS

| | | |
|---|---|---|
| 2010/0207195 A1 | 8/2010 | Fukuzumi et al. |
| 2010/0244152 A1 | 9/2010 | Bahl et al. |
| 2012/0003800 A1 | 1/2012 | Lee et al. |
| 2012/0327715 A1 | 12/2012 | Lee et al. |
| 2013/0126961 A1 | 5/2013 | Fukuzumi et al. |
| 2014/0016408 A1 | 1/2014 | Lee et al. |
| 2014/0217493 A1 | 8/2014 | Fukuzumi et al. |
| 2014/0346585 A1 | 11/2014 | Kuge |
| 2015/0200204 A1 | 7/2015 | Fukuzumi et al. |
| 2016/0240554 A1 | 8/2016 | Fukuzumi et al. |
| 2017/0236835 A1 | 8/2017 | Nakamura et al. |

FOREIGN PATENT DOCUMENTS

| | | |
|---|---|---|
| JP | 2012-15517 | 1/2012 |
| JP | 2012-522363 | 9/2012 |
| JP | 2013-42179 | 2/2013 |
| JP | 5142692 | 2/2013 |
| JP | 5300419 | 9/2013 |

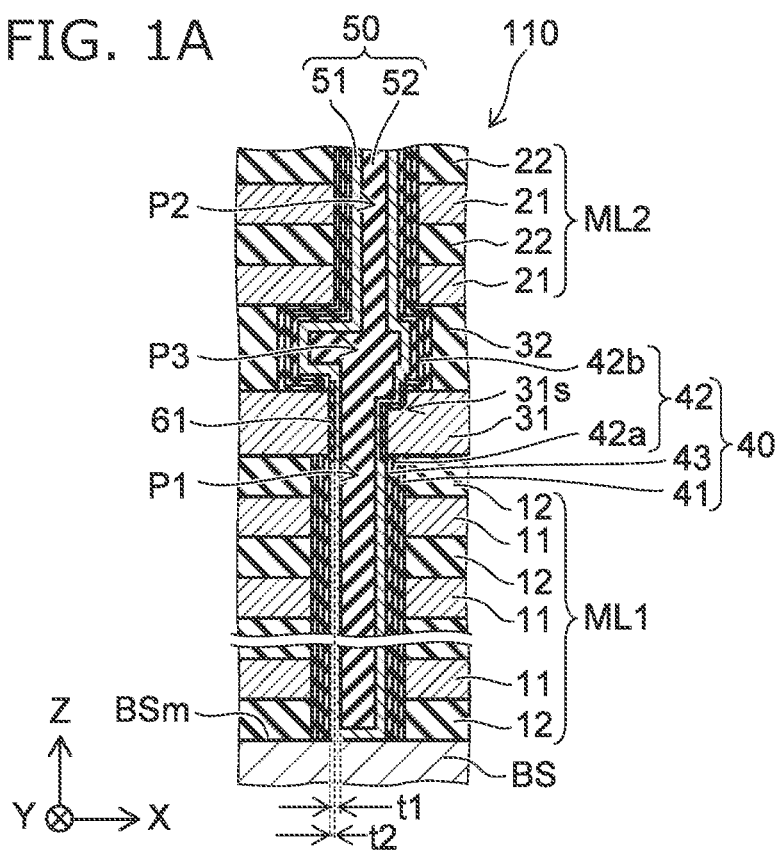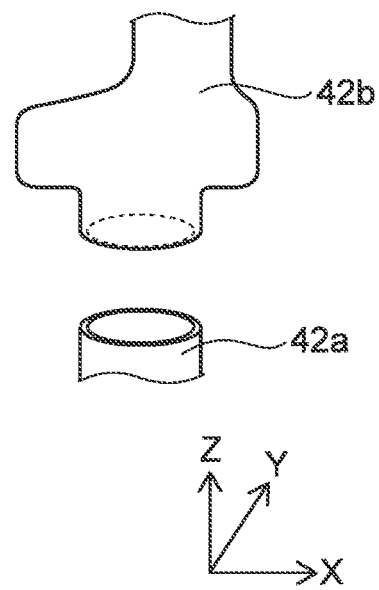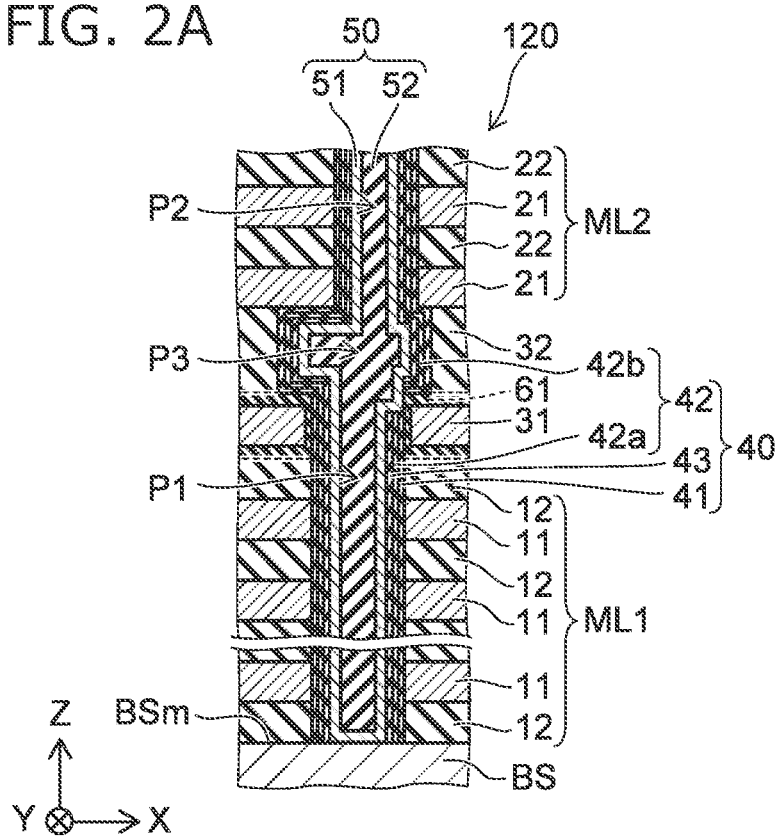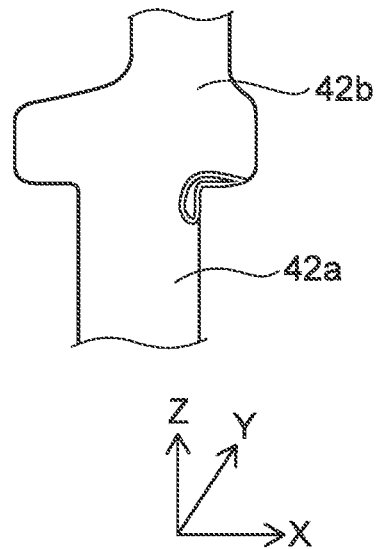

SEMICONDUCTOR MEMORY DEVICE AND METHOD FOR MANUFACTURING THE SAME

CROSS-REFERENCE TO RELATED APPLICATIONS

This application is a continuation of U.S. application Ser. No. 16/511,111, filed Jul. 15, 2019, which is a continuation of U.S. application Ser. No. 15/863,490, filed Jan. 5, 2018 (now U.S. Pat. No. 10,431,590), which is a continuation of U.S. application Ser. No. 15/264,903, filed Sep. 14, 2016 (now U.S. Pat. No. 9,985,044), which is based upon and claims the benefit of priority from U.S. Provisional Patent Application 62/306,672, filed on Mar. 11, 2016; the entire contents of which are incorporated herein by reference.

FIELD

Embodiments described herein relate generally to a semiconductor memory device and a method for manufacturing the same.

BACKGROUND

A semiconductor memory device that has a three-dimensional structure in which memory cells are arranged three-dimensionally has been proposed. When manufacturing such a semiconductor memory device, a stacked body that includes multiple conductive layers is formed on a substrate. Then, holes that pierce the stacked body are formed. When increasing the number of stacks of the stacked body, it becomes difficult to form the holes by collective patterning. It is desirable to be able to increase the number of stacks and increase the memory capacity per surface area.

BRIEF DESCRIPTION OF THE DRAWINGS

FIG. 1A and FIG. 1B are schematic views showing a semiconductor memory device according to a first embodiment;

FIG. 2A and FIG. 2B are schematic views showing a semiconductor memory device according to a second embodiment;

DETAILED DESCRIPTION

Figure 3A:
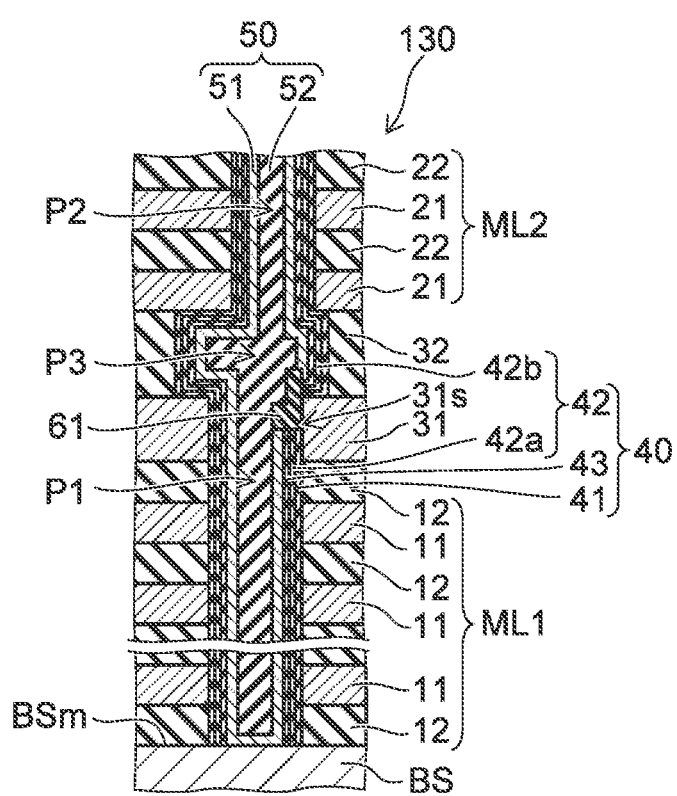
FIG. 3A and FIG. 3B are schematic views showing a semiconductor memory device according to a third embodiment.

A semiconductor memory device according to an embodiment, includes a first stacked body, a second stacked body, an intermediate conductive layer, an intermediate insulating layer, a semiconductor pillar, a charge storage film, and an insulating film. The first stacked body includes a plurality of first conductive layers arranged in a first direction. The second stacked body is arranged in the first direction with the first stacked body and includes a plurality of second conductive layers arranged in the first direction. The intermediate conductive layer provides between the first stacked body and the second stacked body. The intermediate insulating layer provides between the intermediate conductive layer and the second stacked body. The semiconductor pillar includes a first part, a second part, and a third part. The first part extends in the first direction through the first stacked body and through the intermediate conductive layer. The second part extends in the first direction through the second stacked body. The third part is provided inside the intermediate insulating layer and is continuous with the first part and the second part. A central axis of the first part is shifted from a central axis of the second part in a second direction intersecting the first direction. The charge storage film includes a first charge storage portion and a second charge storage portion. The first charge storage portion is provided between the first stacked body and the first part. The second charge storage portion is provided between the second stacked body and the second part and between the intermediate insulating layer and the third part. The charge storage film includes at least one first element selected from the group consisting of nitrogen, hafnium, and aluminum. The insulating film provides in at least a portion between the intermediate conductive layer and the first part. The insulating film not includes the first element, or the insulating film has a concentration of the first element lower than a concentration of the first element of the charge storage film.

First Embodiment

FIG. 1A and FIG. 1B are schematic views showing a semiconductor memory device according to a first embodiment.

FIG. 1A is a cross-sectional view showing the semiconductor memory device according to the first embodiment. FIG. 1B is a perspective view showing the configuration of a charge storage film of the semiconductor memory device according to the first embodiment.

As shown in FIG. 1A, the semiconductor memory device 110 according to the embodiment includes a base body BS, a first stacked body ML1, an intermediate conductive layer 31, an intermediate insulating layer 32, a second stacked body ML2, a semiconductor pillar 50, a memory film 40, and an insulating film 61.

The first stacked body ML1 is provided on a major surface BSm of the base body BS. The second stacked body ML2 is provided on the first stacked body ML1. The intermediate conductive layer 31 is provided between the first stacked body ML1 and the second stacked body ML2. The intermediate insulating layer 32 is provided between the intermediate conductive layer 31 and the second stacked body ML2.

A direction from the first stacked body ML1 toward the second stacked body ML2 is taken as a Z-direction. The major surface BSm intersects the Z-direction. One direction perpendicular to the Z-direction is taken as an X-direction. A direction perpendicular to the Z-direction and the X-direction is taken as a Y-direction.

The semiconductor pillar 50 includes a first part P1 extending in the Z-direction through the first stacked body ML1 and through the intermediate conductive layer 31, a second part P2 extending in the Z-direction through the second stacked body ML2 at a different position from the first part P1, and a third part P3 that is provided inside the intermediate insulating layer 32 and is continuous with the first part P1 and the second part P2. For example, a central axis of the first part P1 is shifted from a central axis of the second part P2 in a direction (for example, X-direction or Y-direction) crossing the Z-direction.

The memory film 40 includes, for example, a blocking insulating film 41, a charge storage film 42, and a tunneling insulating film 43. The memory film 40 is provided between the first part P1 and the first stacked body ML1, between the third part P3 and the intermediate insulating layer 32, and between the second part P2 and the second stacked body ML2. The memory film 40 is discontinuous between the first part P1 and the intermediate conductive layer 31. For example, the memory film 40 is not provided between the first part P1 and the intermediate conductive layer 31.

The charge storage film 42 includes a first charge storage portion 42a and a second charge storage portion 42b. The first charge storage portion 42a is provided between the first part P1 and the first stacked body ML1. The second charge storage portion 42b is provided between the second part P2 and the second stacked body ML2. The second charge storage portion 42b is provided also between the third part P3 and the intermediate insulating layer 32.

As shown in FIG. 1B, the charge storage portion 42a and the charge storage portion 42b each have tubular configurations. The first charge storage portion 42a is provided to be separated from the second charge storage portion 42b in the Z-direction. As shown in FIG. 1A, the first charge storage portion 42a is discontinuous with the second charge storage portion 42b between the first part P1 and the intermediate conductive layer 31. For example, there is no charge storage film 42 between the first part P1 and the intermediate conductive layer 31.

The blocking insulating film 41 is provided between the first charge storage portion 42a and the first stacked body ML1, between the second charge storage portion 42b and the intermediate insulating layer 32, and between the second charge storage portion 42b and the second stacked body ML2.

The tunneling insulating film 43 is provided between the first part P1 and the first charge storage portion 42a, between the third part P3 and the second charge storage portion 42b, and between the second part P2 and the second charge storage portion 42b.

The insulating film 61 is provided in at least a portion between the first part P1 and the intermediate conductive layer 31. The semiconductor pillar 50 is insulated from the intermediate conductive layer 31 by the insulating film 61.

The semiconductor pillar 50 includes, for example, a semiconductor film 51. The semiconductor pillar 50 may include a core insulating film 52 in addition to the semiconductor film 51. The core insulating film 52 extends in the Z-direction through the first stacked body ML1, through the intermediate conductive layer 31, through the intermediate insulating layer 32, and through the second stacked body ML2. The semiconductor film 51 is provided between the core insulating film 52 and the memory film 40 and between the core insulating film 52 and the insulating film 61. For example, a thickness t1 of the semiconductor film 51 between the core insulating film 52 and the memory film 40 is thinner than a thickness t2 of the semiconductor film 51 between the core insulating film 52 and the insulating film 61. For example, the thickness t1 and the thickness t2 are lengths in one direction perpendicular to the Z-direction.

The charge storage film 42 includes at least one first element selected from the group consisting of nitrogen, hafnium, and aluminum. The insulating film 61 includes, for example, silicon oxide. The concentration of the first element of the insulating film 61 is lower than the concentration of the first element of the charge storage film 42. The insulating film 61 may not include the first element. At least a portion of the insulating film 61 does not overlap the charge storage film 42 in a direction (e.g., the X-direction) intersecting the Z-direction.

In other words, in the embodiment, the memory film 40 that includes the charge storage film 42 is not provided between the intermediate conductive layer 31 and the first part P1.

On the other hand, there is a reference example in which the memory film 40 that includes the charge storage film 42 is provided also between the intermediate conductive layer 31 and the first part P1. In the reference example, for example, if the intermediate conductive layer 31 includes a stepped portion 31s as shown in FIG. 1A, fluctuation of the threshold voltage caused by the stepped portion 31s occurs.

Conversely, in the embodiment, there is no memory film 40 including the charge storage film 42 between the first part P1 and the intermediate conductive layer 31 including the stepped portion 31s. Thereby, the fluctuation of the threshold voltage is reduced even in the case where the intermediate conductive layer 31 includes the stepped portion 31s.

In the embodiment, the insulating film 61 is provided between the intermediate conductive layer 31 and the first part P1 instead of the memory film 40 including the charge storage film 42 recited above. The first part P1 (the semiconductor film 51) and the intermediate conductive layer 31 are electrically insulated by the insulating film 61.

As described below, for example, the first part P1 and the second part P2 recited above are formed by forming holes in each of the first stacked body ML1 and the second stacked body ML2 and forming the semiconductor film 51 inside these holes. By the positions of these two holes being shifted, the positions of the first part P1 and the second part P2 are shifted; and the stepped portion 31s occurs. In the embodiment, at least a portion of the insulating film 61 does not overlap the charge storage film 42 in a direction (e.g., the X-direction) intersecting the Z-direction. In other words, there is no memory film 40 including the charge storage film 42 between the first part P1 and the intermediate conductive layer 31. Thereby, the fluctuation of the threshold voltage is reduced even if the stepped portion 31s occurs. In the embodiment, for example, even if the number of stacks increases, good characteristics can be maintained. For example, to easily increase the number of stacks; and the memory capacity per surface area can be increased.

In the example, the first stacked body ML1 includes multiple first conductive layers 11 arranged in the Z-direction. In the example, the first stacked body ML1 includes the multiple first conductive layers 11 and multiple first insulating layers 12 arranged alternately along the Z-direction.

The second stacked body ML2 includes multiple second conductive layers 21 arranged in the Z-direction. In the example, the second stacked body ML2 includes the multiple second conductive layers 21 and multiple second insulating layers 22 arranged alternately in the Z-direction.

The third part P3 is wider than each of the first part P1 and the second part P2. In other words, the length of the third part P3 in at least one direction (e.g., at least one of a X-direction or a Y-direction) intersecting the Z-direction is longer than each of the length of the first part P1 in the one direction (e.g., the at least one of the X-direction or the Y-direction) recited above intersecting the Z-direction and the length of the second part P2 in the one direction (e.g., the at least one of the X-direction or the Y-direction) recited above intersecting the Z-direction.

There is a reference example in which the first part P1 and the second part P2 are connected without providing the third part P3. A connection unit between the first part P1 and the second part P2 is positioned inside the intermediate insulating layer 32. In the reference example, the semiconductor film 51 is bent at a portion distal to the intermediate conductive layer 31 and the second conductive layer 21. In the case where the semiconductor film 51 is bent at the portion distal to the intermediate conductive layer 31 and the second conductive layer 21, the resistance of the semiconductor film 51 increases. For example, the ON current decreases due to the increase of the resistance of the semiconductor film 51.

In the embodiment, the third part P3 is provided between the first part P1 and the second part P2. The third part P3 is wider than each of the first part P1 and the second part P2. The first part P1 and the second part P2 are connected smoothly by the third part P3. The bend of the semiconductor film 51 at the portion distal to the intermediate conductive layer 31 and the second conductive layer 21 is suppressed by the third part P3. For example, the increase of the resistance of the semiconductor film 51 is suppressed. Thereby, a good ON current can be maintained.

In the embodiment, even in the case where the positions of the first part P1 and the second part P2 are shifted and the stepped portion 31s occurs, the bend of the semiconductor film 51 at the portion distal to the intermediate conductive layer 31 and the second conductive layer 21 is suppressed; and a good ON current can be maintained. Thereby, a good ON current can be maintained even in the case where the number of stacks in the stacked body is increased and the positions of the multiple holes are shifted. In the embodiment, for example, even if the number of stacks is increased, good characteristics can be maintained. For example, to easily increase the number of stacks; and the memory capacity per surface area can be increased.

Second Embodiment

In the embodiment, there is a region where there is no memory film 40 in a portion between the intermediate conductive layer 31 and the first part P1. The insulating film 61 is provided in this region. FIG. 2A and FIG. 2B are schematic views showing a semiconductor memory device according to the second embodiment.

FIG. 2A is a cross-sectional view showing the semiconductor memory device according to the second embodiment. FIG. 2B is a perspective view showing the configuration of the charge storage film of the semiconductor memory device according to the second embodiment.

In the semiconductor memory device 120 according to the embodiment as shown in FIG. 2A, the memory film 40 that includes the charge storage film 42 is provided in a portion between the intermediate conductive layer 31 and the first part P1. The insulating film 61 is provided between the memory film 40 and the intermediate conductive layer 31 and in another portion between the first part P1 and the intermediate conductive layer 31.

As shown in FIG. 2B, in the charge storage film 42, at least portions of the first charge storage portion 42a and the second charge storage portion 42b are linked.

In the embodiment, the third part P3 is provided between the first part P1 and the second part P2. The first part P1 and the second part P2 are connected smoothly by the third part P3. Thereby, a good ON current can be maintained. In the embodiment, for example, even if the number of stacks is increased, good characteristics can be maintained. For example, to easily increase the number of stacks; and the memory capacity per surface area can be increased.

Third Embodiment

In the embodiment, there is a region where there is no memory film 40 or semiconductor film 51 in a portion between the intermediate conductive layer 31 and the core insulating film 52. The insulating film 61 is provided in this region.

Figure 3B:
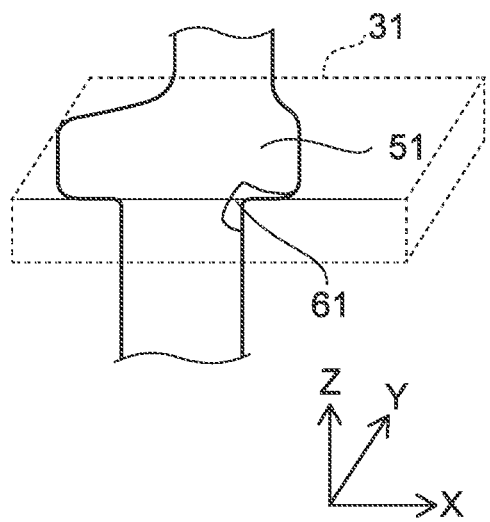

FIG. 3A and FIG. 3B are schematic views showing a semiconductor memory device according to the third embodiment.

FIG. 3A is a cross-sectional view showing the semiconductor memory device according to the third embodiment. FIG. 3B is a perspective view showing the configuration of the semiconductor film of the semiconductor memory device according to the third embodiment.

In the semiconductor memory device 130 according to the embodiment as shown in FIG. 3A, the memory film 40 that includes the charge storage film 42 is provided in a portion between the intermediate conductive layer 31 and the first part P1. As shown in FIG. 3A and FIG. 3B, the insulating film 61 is provided in another portion between the intermediate conductive layer 31 and the core insulating film 52 of the first part P1. The semiconductor film 51 is not provided between the core insulating film 52 and the insulating film 61.

The insulating film 61 may be formed as one body with the core insulating film 52. In other words, a boundary may not exist between the insulating film 61 and the core insulating film 52.

In the embodiment, the third part P3 is provided between the first part P1 and the second part P2. The first part P1 and the second part P2 are connected smoothly by the third part P3. Thereby, a good ON current is obtained. In the embodiment, for example, even if the number of stacks is increased, good characteristics can be maintained. For example, to easily increase the number of stacks; and the memory capacity per surface area can be increased.

Fourth Embodiment

A method for manufacturing a semiconductor memory device according to the embodiment corresponds to the method for manufacturing the semiconductor memory device 110.

FIG. 4A to FIG. 7B are cross-sectional views of processes, showing the method for manufacturing the semiconductor memory device according to the fourth embodiment.

Figure 4A:
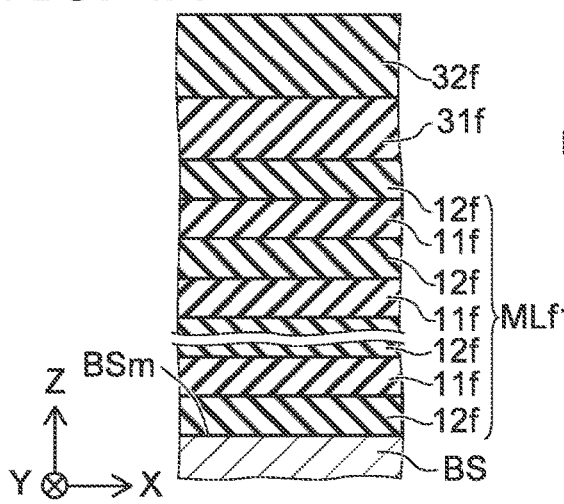
FIG. 4A to FIG. 7B are cross-sectional views of processes, showing the method for manufacturing the semiconductor memory device according to the fourth embodiment.

As shown in FIG. 4A, a first structure body MLf1 is formed on the major surface BSm of the base body BS. The first structure body MLf1 is formed by stacking multiple first films 11f and multiple second films 12f alternately. The first film 11f is a film including silicon nitride. The second film 12f is a film including silicon oxide.

An intermediate film 31f is formed on the first structure body MLf1. An intermediate insulating film 32f is formed on the intermediate film 31f. The intermediate film 31f is formed using a material different from the first film 11f and the second film 12f. For example, the intermediate film 31f is formed using at least one of aluminum oxide or hafnium oxide.

Figure 4B:
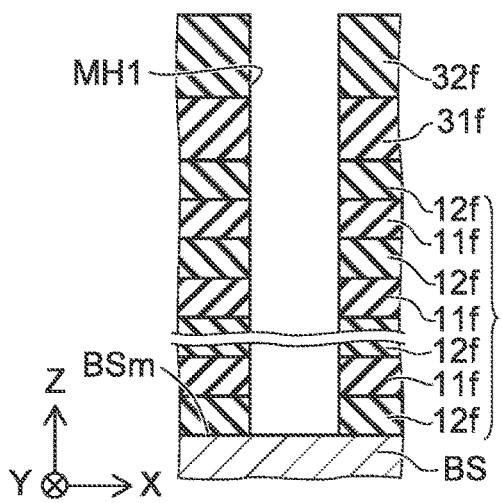

As shown in FIG. 4B, a first hole MH1 is formed in the first structure body MLf1, the intermediate film 31f, and the intermediate insulating film 32f. The first hole MH1 pierces the first structure body MLf1, the intermediate film 31f, and the intermediate insulating film 32f in the Z-direction.

Figure 4C:
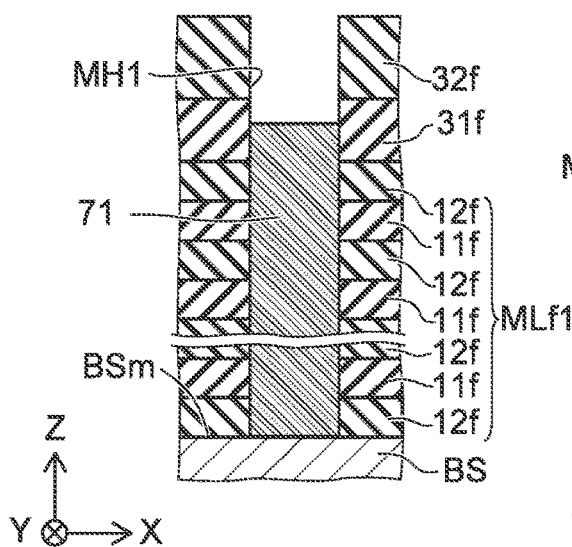

As shown in FIG. 4C, a first member 71 is formed inside the first hole MH1. For example, the first member 71 is formed of a material including polysilicon. At this time, the first member 71 is not formed at the portion of the first hole MH1 piercing the intermediate insulating film 32f. In other words, the first member 71 is formed in the portion of the first hole MH1 piercing the first structure body MLf1 and the portion of the first hole MH1 piercing the intermediate film 31f.

Figure 4D:
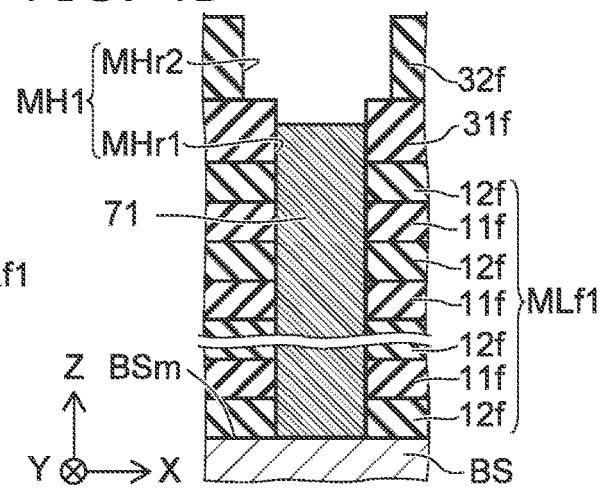

As shown in FIG. 4D, a portion of the intermediate insulating film 32f inside the first hole MH1 is removed. For example, the portion of the intermediate insulating film 32f is etched via the first hole MH1. Thereby, the portion of the intermediate insulating film 32f is removed. The diameter of a portion of the first hole MH1 is increased by removing the portion of the intermediate insulating film 32f.

Thereby, the first hole MH1 that includes a first region MHr1 and a second region MHr2 is formed, where the first region MHr1 extends along the Z-direction through the first structure body MLf1 and through the intermediate film 31f, and the second region MHr2 is continuous with the first region MHr1 and extends along the Z-direction through the intermediate insulating film 32f. The diameter of the second region MHr2 is larger than the diameter of the first region MHr1.

Figure 4E:
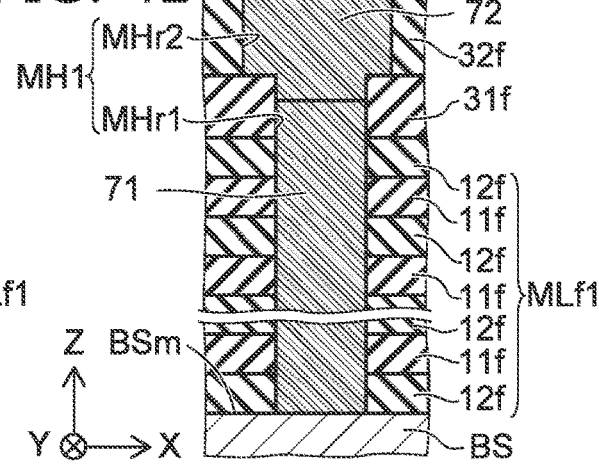

As shown in FIG. 4E, a second member 72 is formed inside the second region MHr2. For example, the second member 72 is formed of a material including polysilicon. Thereby, the first hole MH1 is filled with the first member 71 and the second member 72.

Figure 4F:
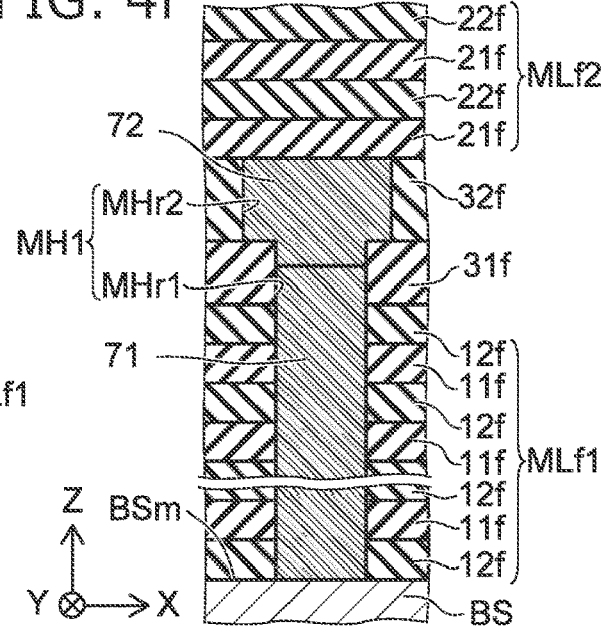

As shown in FIG. 4F, a second structure body MLf2 is formed on the intermediate insulating film 32f and on the second member 72. For example, multiple third films 21f and multiple fourth films 22f are stacked alternately on the intermediate insulating film 32f and on the second member 72. Thereby, the second structure body is formed. The third film 21f is a film including silicon nitride. The fourth film 22f is a film including silicon oxide.

Figure 5A:
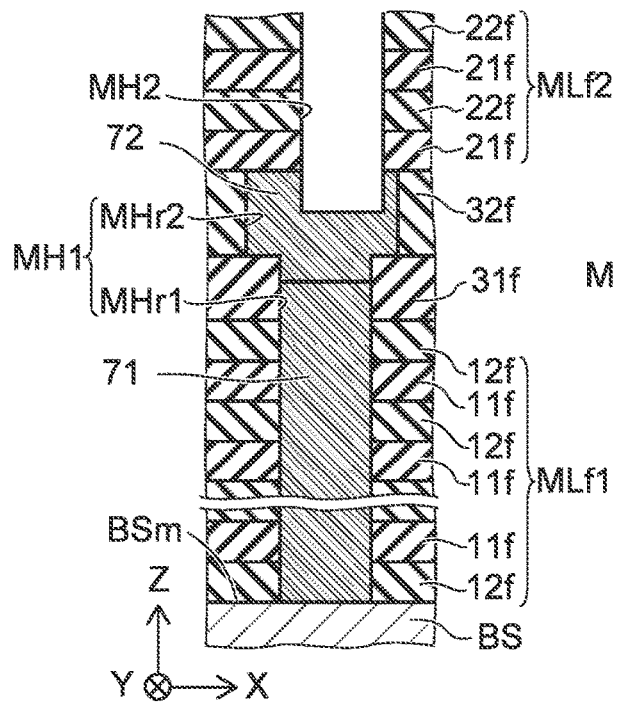

As shown in FIG. 5A, a second hole MH2 that extends along the Z-direction through the second structure body MLf2 at a different position from the first region MHr1 is formed. The second hole MH2 reaches the second region MHr2. The second hole MH2 is continuous with the first hole MH1.

Figure 5C:
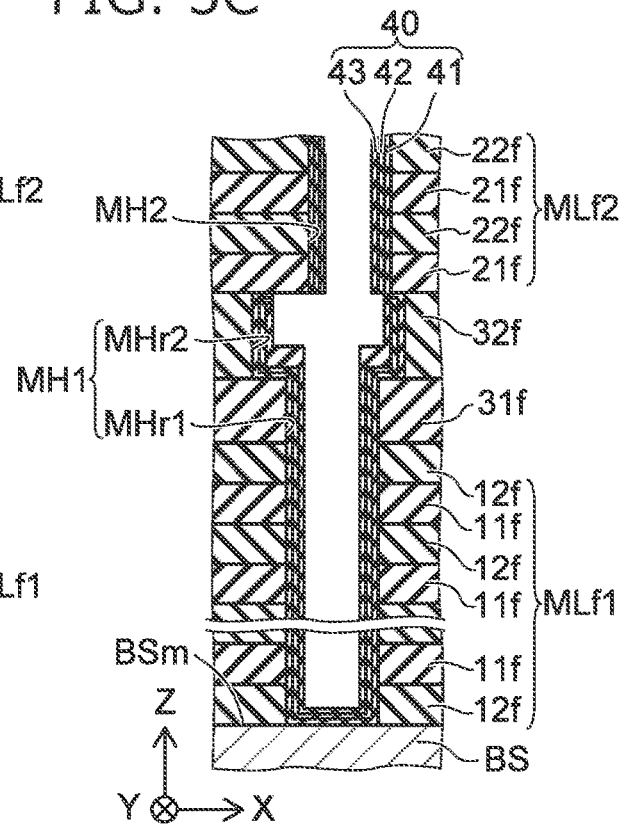
Figure 5B:
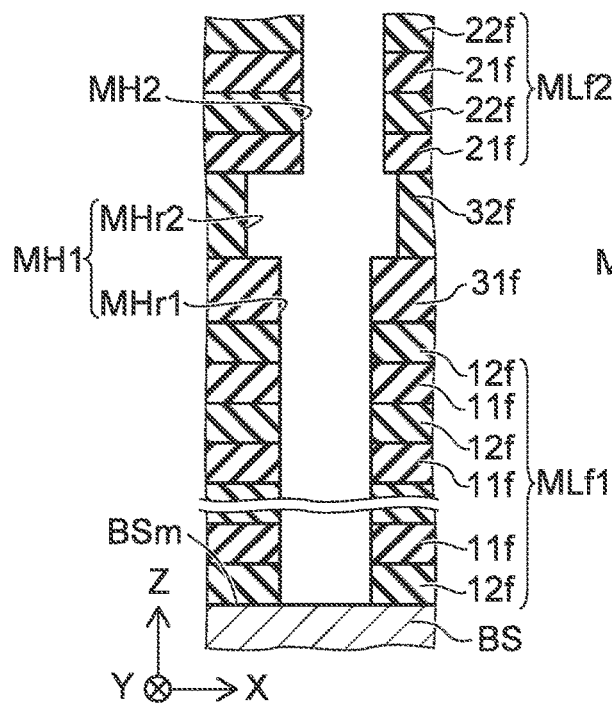

As shown in FIG. 5B, the first member 71 and the second member 72 that are inside the first hole MH1 are removed. For example, the first member 71 and the second member 72 are removed by introducing a prescribed etchant to the first hole MH1 via the second hole MH2.

As shown in FIG. 5C, the memory film 40 is formed on the inner wall of the first hole MH1 and the side wall of the second hole MH2. For example, the blocking insulating film 41 is formed on the inner wall of the first hole MH1 and the side wall of the second hole MH2. The charge storage film 42 is formed on the inner wall of the blocking insulating film 41. The tunneling insulating film 43 is formed on the inner wall of the charge storage film 42. Thereby, the memory film 40 that includes the blocking insulating film 41, the charge storage film 42, and the tunneling insulating film 43 is formed.

Figure 5D:
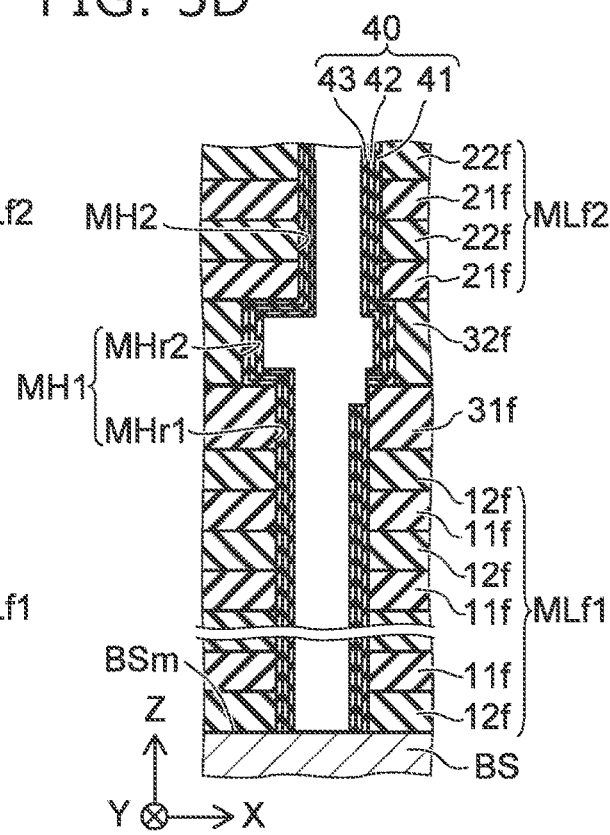

As shown in FIG. 5D, the memory film 40 that is formed on the bottom of the first hole MH1 is removed. At this time, the memory film 40 remains on the side wall of the first hole MH1 and the side wall of the second hole MH2. For example, RIE (reactive ion etching) is performed using a mask (not shown). Thereby, the memory film 40 that is formed on the bottom of the first hole MH1 is removed. At this time, a portion of the memory film 40 formed on the side wall of the intermediate film 31f may be removed.

Figure 6A:
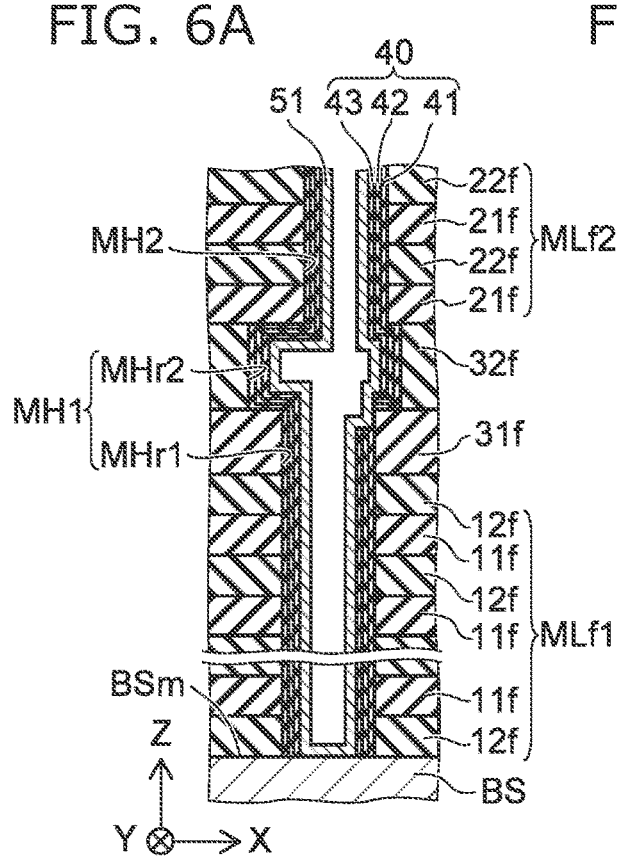

As shown in FIG. 6A, the semiconductor film 51 is formed on the side wall of the memory film 40 and the bottom of the first hole MH1. In the case where a portion of the intermediate film 31f is exposed from the memory film 40 inside the first hole MH1, the semiconductor film 51 is formed also on the exposed surface of the intermediate film 31f.

Figure 6B:
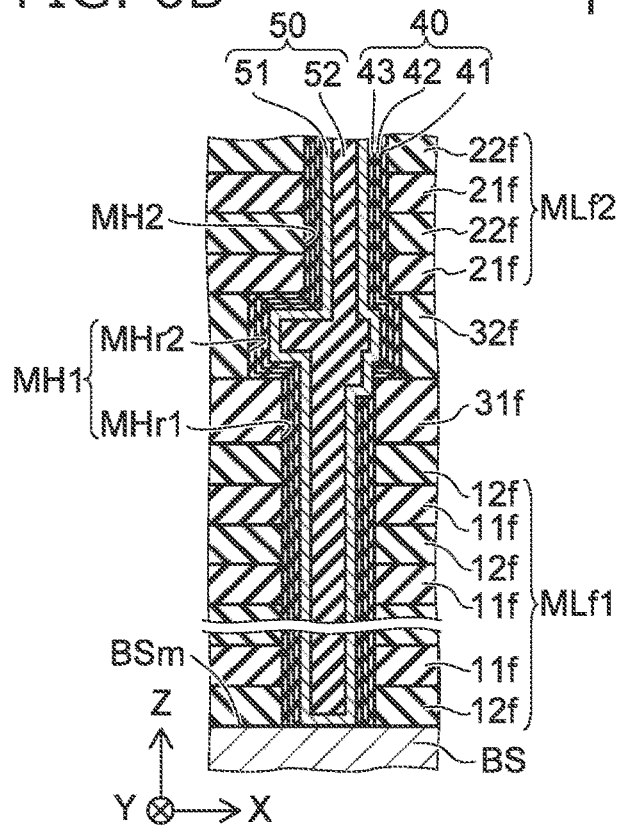

As shown in FIG. 6B, the core insulating film 52 is formed inside the first hole MH1 and inside the second hole MH2. The first hole MH1 and the second hole MH2 are filled with the core insulating film 52. Thereby, the semiconductor pillar 50 that includes the semiconductor film 51 and the core insulating film 52 is formed inside the first hole MH1 and inside the second hole MH2.

Figure 6C:
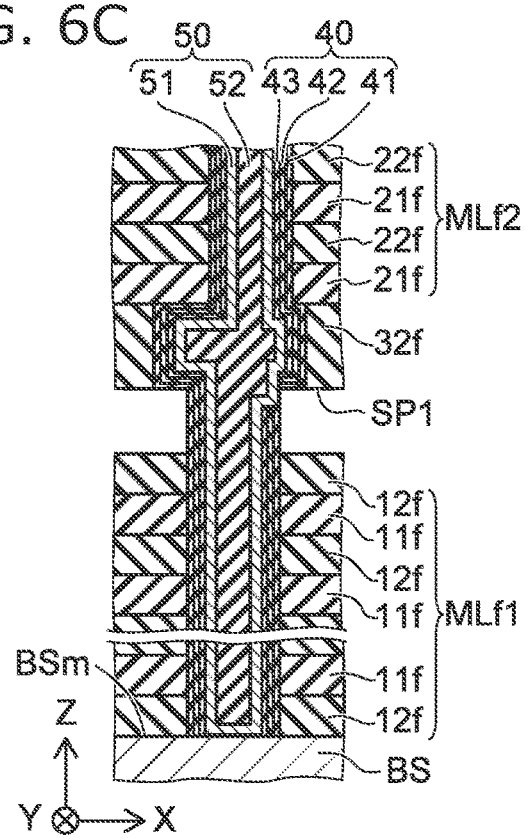

The intermediate film 31f is removed as shown in FIG. 6C. For example, a slit (not shown) that pierces the first structure body MLf1, the intermediate film 31f, the intermediate insulating film 32f, and the second structure body MLf2 in the Z-direction is formed. The intermediate film 31f is etched by introducing a prescribed etchant to the slit. The etching is performed at conditions such that the etching rate of the intermediate film 31f is higher than each of the etching rate of the first structure body MLf1, the etching rate of the intermediate insulating film 32f, and the etching rate of the second structure body MLf2. Thereby, the intermediate film 31f is removed.

Figure 6D:
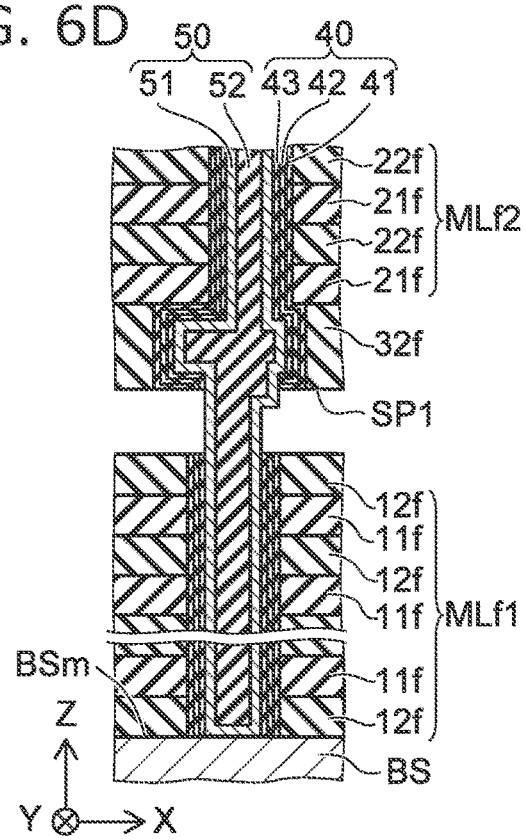

As shown in FIG. 6D, a portion of the memory film 40 is removed via a first space SP1 made where the intermediate film 31f was removed. Thereby, a portion of the semiconductor film 51 is exposed inside the first space SP1.

Figure 7A:
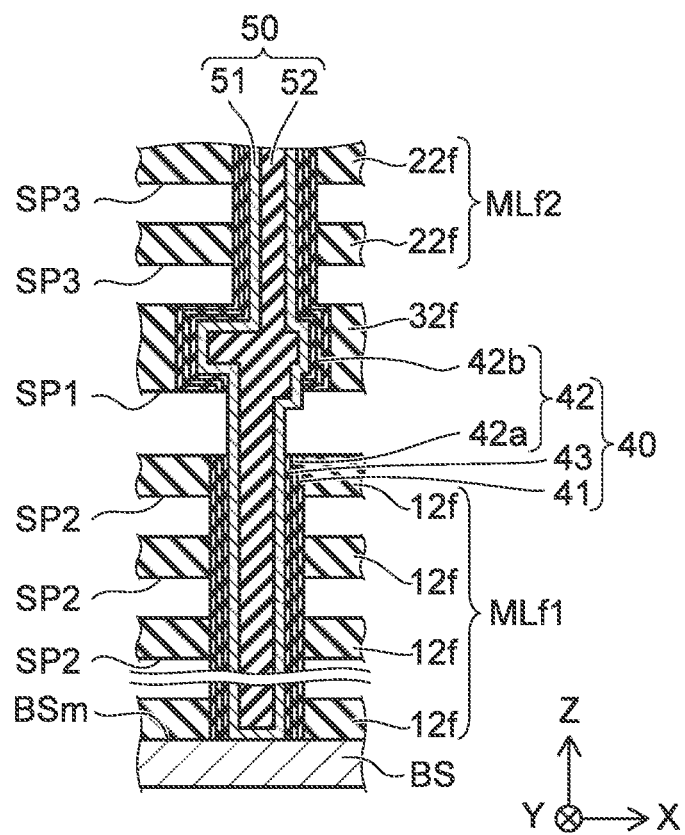

The first films 11f and the third films 21f are removed as shown in FIG. 7A. For example, the first films 11f and the third films 21f are removed by introducing a prescribed etchant to the slit (not shown) described above. Second spaces SP2 are formed by removing the first films 11f. Third spaces SP3 are formed by removing the third films 21f.

Figure 7B:
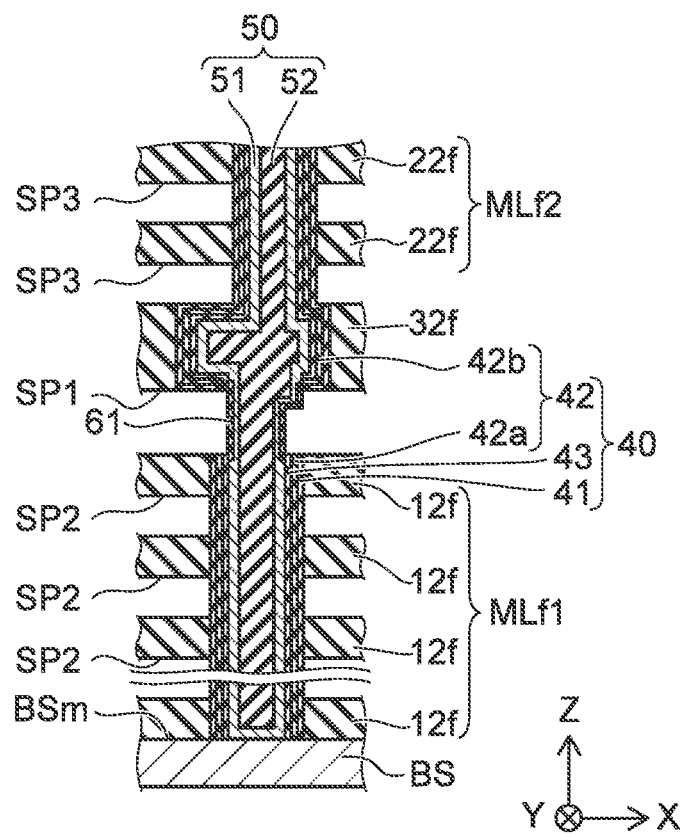

As shown in FIG. 7B, a portion of the semiconductor film 51 inside the first space SP1 is oxidized. For example, the portion of the semiconductor film 51 is oxidized by introducing an oxidizing agent to the first space SP1. Thereby, the insulating film 61 is formed between the first space SP1 and the remainder of the semiconductor film 51.

A conductive material is provided inside the first space SP1, inside the second spaces SP2, and inside the third spaces SP3. Thereby, as shown in FIG. 1A, the intermediate conductive layer 31 is formed inside the first space SP1. The first conductive layers 11 are formed inside the second spaces SP2. The second conductive layers 21 are formed inside the third spaces SP3. The multiple second films 12f are used as the multiple first insulating layers 12. The multiple fourth films 22f are used as the multiple second insulating layers 22. The first structure body MLf1 is used as the first stacked body ML1. The second structure body MLf2 is used as the second stacked body ML2.

By implementing the processes recited above, the semiconductor memory device 110 can be manufactured.

In the embodiment, the formation of the hole piercing the structure body is performed by dividing into two formations. In other words, the intermediate film 31f, the intermediate insulating film 32f, and the second structure body MLf2 are formed on the first structure body MLf1 after forming the first hole MH1 in the first structure body MLf1. Subsequently, the second hole MH2 is formed. Thereby, a hole can be formed that is deeper than the depth of a hole that can be formed as a whole in the structure body.

In the case where the formation of the hole is performed by dividing into two formations, a portion of the memory film formed inside the hole may be removed. In the embodiment, the insulating film 61 is formed by oxidizing the semiconductor film 51 exposed from the memory film 40. Thereby, shorts between the semiconductor pillar 50 (the semiconductor film 51) and the conductive layers (e.g., the intermediate conductive layer 31, etc.) can be suppressed. The yield of the manufacturing processes of the semiconductor memory device increases.

Fifth Embodiment

The embodiment corresponds to a method for manufacturing the semiconductor memory device 120 according to the second embodiment described above.

Figure 8A:
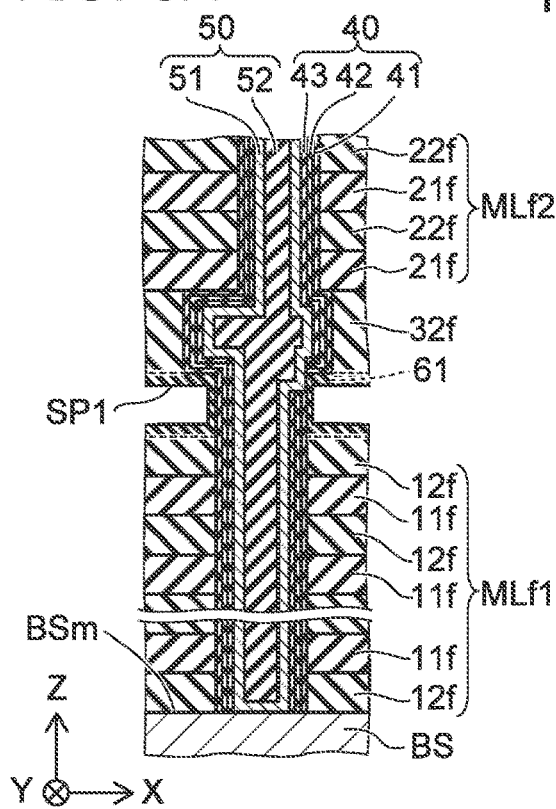
FIG. 8A and FIG. 8B are schematic cross-sectional views in order of the processes, showing the method for manufacturing the semiconductor memory device according to the fifth embodiment.
Figure 8B:
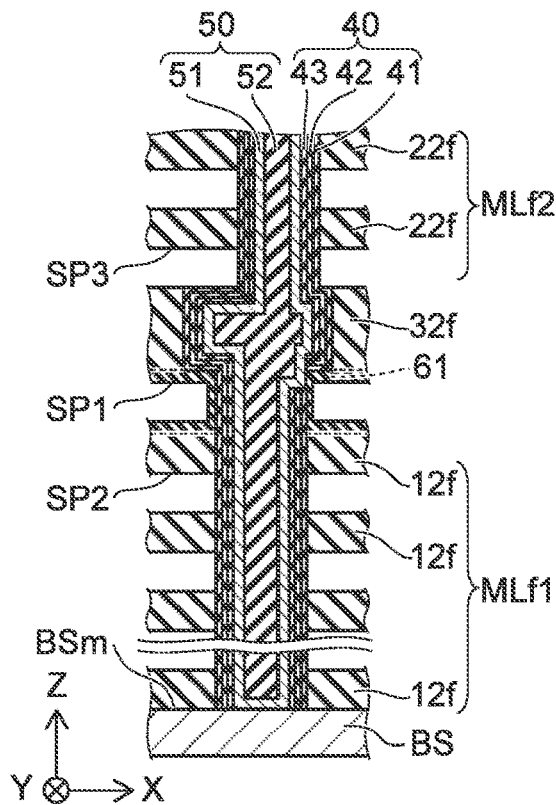

FIG. 8A and FIG. 8B are schematic cross-sectional views in order of the processes, showing the method for manufacturing the semiconductor memory device according to the fifth embodiment.

Similarly to the manufacturing method according to the fourth embodiment described above, the processes shown in FIG. 4A to FIG. 6C are implemented.

As shown in FIG. 8A, the insulating film 61 is formed on the inner wall of the first space SP1. The first films 11f and the third films 21f are removed as shown in FIG. 8B. The second spaces SP2 are formed by removing the first films 11f. The third spaces SP3 are formed by removing the third films 21f.

A conductive material is provided inside the first space SP1, inside the second spaces SP2, and inside the third spaces SP3. Thereby, as shown in FIG. 2A, the intermediate conductive layer 31 is formed inside the first space SP1. The first conductive layers 11 are formed inside the second spaces SP2. The second conductive layers 21 are formed inside the third spaces SP3. The multiple second films 12f are used as the multiple first insulating layers 12. The multiple fourth films 22f are used as the multiple second insulating layers 22. The first structure body MLf1 is used as the first stacked body ML1. The second structure body MLf2 is used as the second stacked body ML2. The formation of the insulating film 61 may be performed after the formation of the second space SP2 and the third space SP3. In this case, the insulating film 61 is formed also on an inner wall of the first space SP1, an inner wall of the second space SP1 and an inner wall of third space SP3.

By implementing the processes recited above, the semiconductor memory device 120 can be manufactured.

In the embodiment, the process of removing the memory film 40 exposed inside the first space SP1 is omitted. Thereby, the number of processes can be reduced.

Sixth Embodiment

The embodiment corresponds to a method for manufacturing the semiconductor memory device 130 according to the third embodiment described above.

Figure 9A:
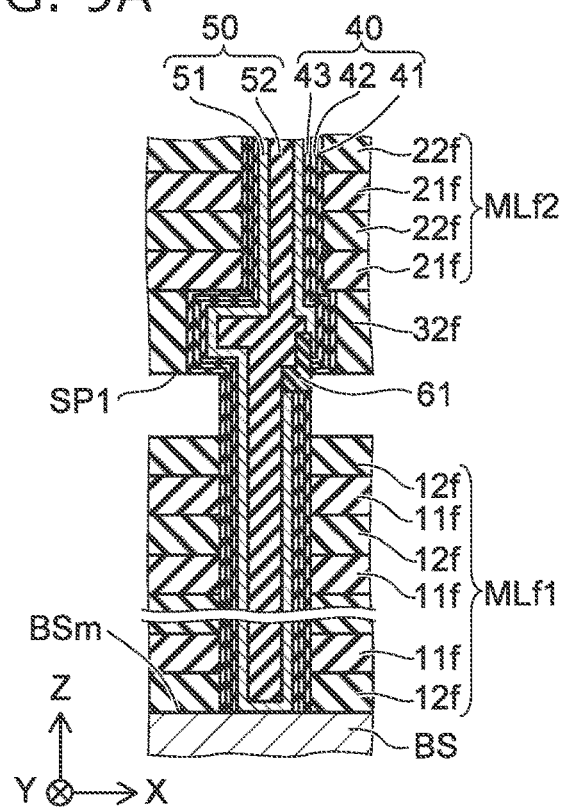
FIG. 9A and FIG. 9B are schematic cross-sectional views in order of the processes, showing the method for manufacturing the semiconductor memory device according to a sixth embodiment.
Figure 9B:
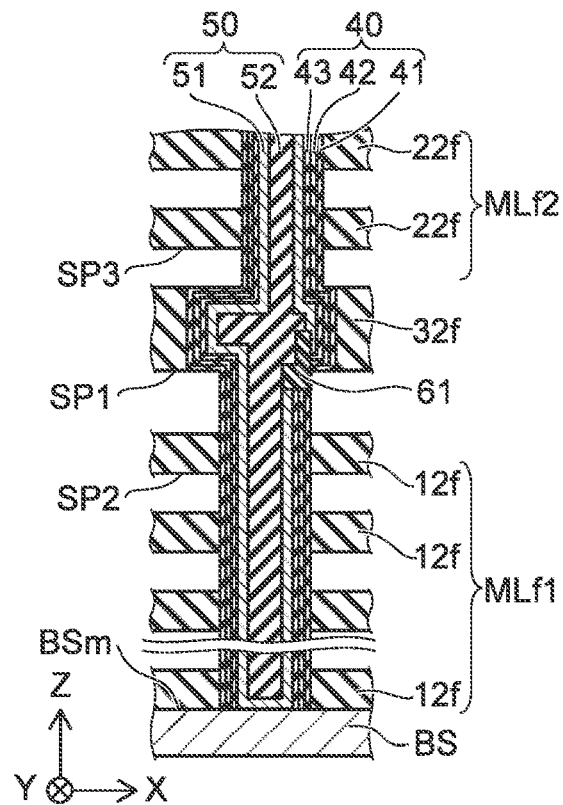

FIG. 9A and FIG. 9B are schematic cross-sectional views in order of the processes, showing the method for manufacturing the semiconductor memory device according to the sixth embodiment.

Similarly to the manufacturing method according to the fourth embodiment described above, the processes shown in FIG. 4A to FIG. 6C are implemented.

As shown in FIG. 9A, the insulating film 61 is formed by oxidizing the portion of the semiconductor film 51 exposed from the memory film 40 inside the first space SP1. For example, an oxidizing agent is introduced to the first space SP1. The portion of the semiconductor film 51 exposed from the memory film 40 is oxidized by the oxidizing agent.

The first films 11f and the third films 21f are removed as shown in FIG. 9B. The second spaces SP2 are formed by removing the first films 11f. The third spaces SP3 are formed by removing the third films 21f.

A conductive material is provided inside the first space SP1, inside the second spaces SP2, and inside the third spaces SP3. Thereby, as shown in FIG. 2A, the intermediate conductive layer 31 is formed inside the first space SP1. The first conductive layers 11 are formed inside the second spaces SP2. The second conductive layers 21 are formed inside the third spaces SP3. The multiple second films 12f are used as the multiple first insulating layers 12. The multiple fourth films 22f are used as the multiple second insulating layers 22. The first structure body MLf1 is used as the first stacked body ML1. The second structure body MLf2 is used as the second stacked body ML2.

By implementing the processes recited above, the semiconductor memory device 130 can be manufactured.

In the embodiment, the process of removing the memory film 40 exposed inside the first space SP1 is omitted. Thereby, the number of processes can be reduced.

Seventh Embodiment

The embodiment corresponds to a method for manufacturing the semiconductor memory device 130 according to the third embodiment. The embodiment is a manufacturing method in the case where the intermediate film 31f is not formed between the first structure body MLf1 and the intermediate insulating film 32f.

FIG. 10A to FIG. 11D are schematic cross-sectional views in order of the processes, showing the method for manufacturing the semiconductor memory device according to the seventh embodiment.

Figure 10A:
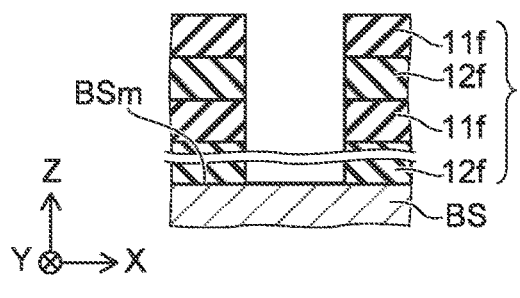
FIG. 10A to FIG. 11D are schematic cross-sectional views in order of the processes, showing the method for manufacturing the semiconductor memory device according to a seventh embodiment.

As shown in FIG. 10A, the first structure body MLf1 is formed on the major surface BSm of the base body BS. The first structure body MLf1 is formed by stacking the multiple first films 11f and the multiple second films 12f alternately on the major surface BSm. The first film 11f is a film including silicon nitride. The second film 12f is a film including silicon oxide. A hole (the first region MHr1) is formed in the first structure body MLf1.

Figure 10B:
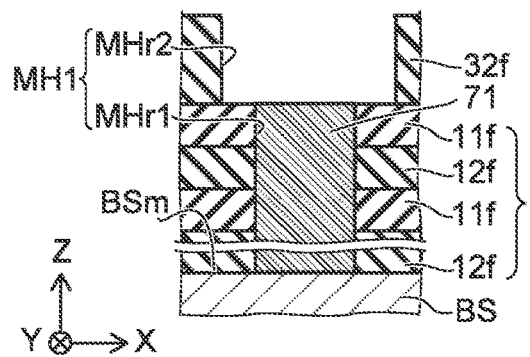

As shown in FIG. 10B, the first member 71 is formed inside the first region MHr1. The intermediate insulating film 32f is formed on the first structure body MLf1 and on the first member 71. A hole (the second region MHr2) is formed in the intermediate insulating film 32f. For example, the diameter of the second region MHr2 is larger than the diameter of the first region MHr1. Thereby, the first hole MH1 that includes the first region MHr1 and the second region MHr2 is formed.

Figure 10C:
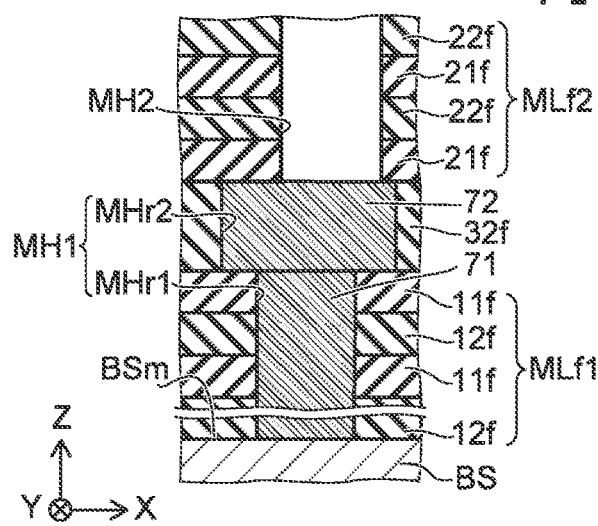

As shown in FIG. 10C, the second member 72 is formed inside the second region MHr2. The second structure body MLf2 is formed on the intermediate insulating film 32f and on the second member 72. The second structure body MLf2 is formed by stacking the multiple third films 21f and the multiple fourth films 22f alternately on the intermediate insulating film 32f and on the second member 72.

Figure 10D:
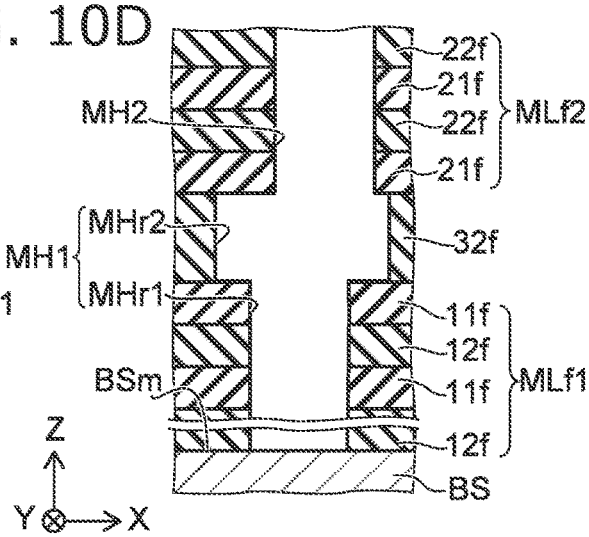

The second hole MH2 that extends in the Z-direction through the second structure body MLf2 is formed at a different position from the first hole MH1. The second hole MH2 is continuous with the first hole MH1. The first member 71 and the second member 72 are removed as shown in FIG. 10D.

Figure 10E:
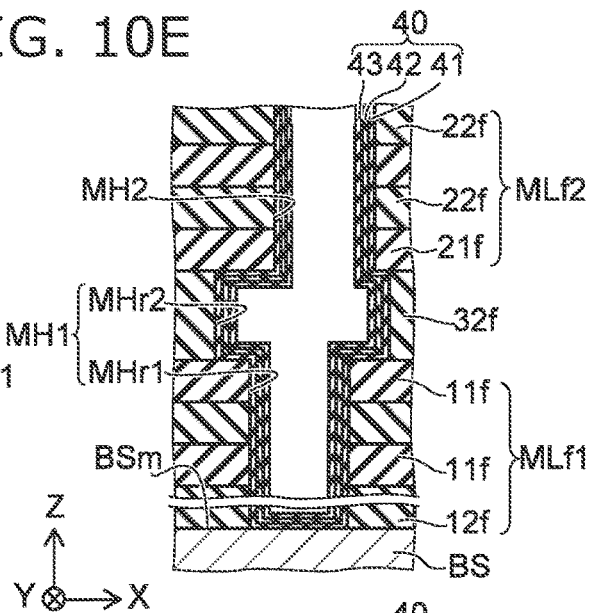

As shown in FIG. 10E, the memory film 40 is formed on the inner wall of the first hole MH1 and the side wall of the second hole MH2. For example, the blocking insulating film 41 is formed on the inner wall of the first hole MH1 and the side wall of the second hole MH2. The charge storage film 42 is formed on the inner wall of the blocking insulating film 41. The tunneling insulating film 43 is formed on the inner wall of the charge storage film 42. Thereby, the memory film 40 that includes the blocking insulating film 41, the charge storage film 42, and the tunneling insulating film 43 is formed.

Figure 10F:
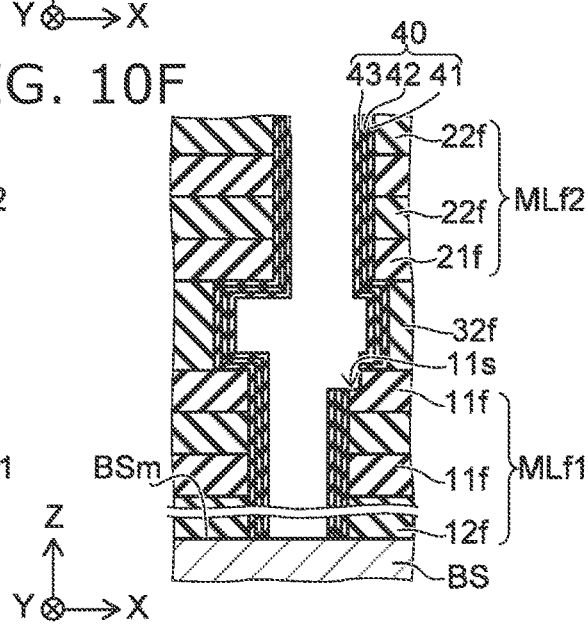

As shown in FIG. 10F, the portion of the memory film 40 formed on the bottom of the first hole MH1 is removed. For example, a mask (not shown) is formed on the second structure body MLf2. Subsequently, RIE is performed using the mask (not shown). Thereby, the portion of the memory film 40 formed on the bottom of the first hole MH1 is removed. At this time, a portion of the memory film formed on the side wall of the first hole MH1 may be removed. Further, a portion of the first film 11f most distal to the base body BS of the first films 11f included in the first structure body MLf1 may be removed in addition to the portion of the memory film 40. In such a case, a stepped portion 11s is formed in the first film 11f.

Figure 11A:
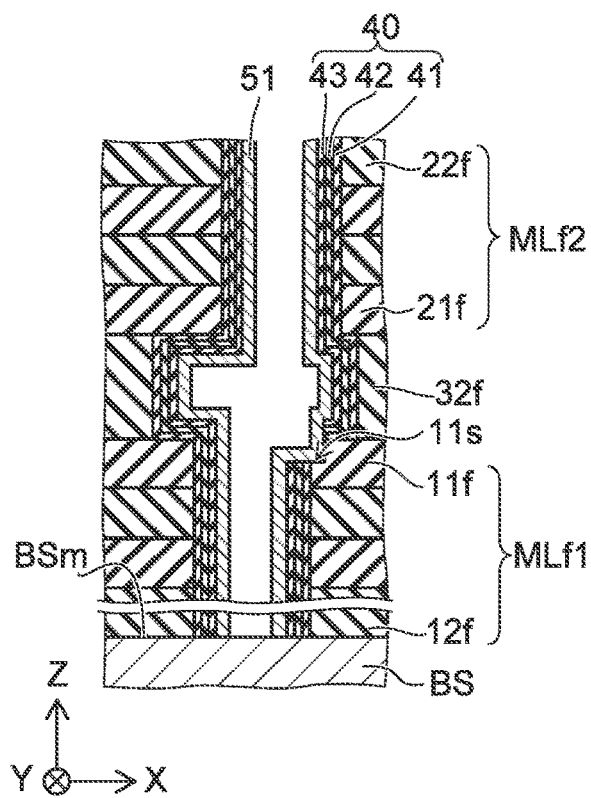

As shown in FIG. 11A, the semiconductor film 51 is formed on the bottom of the first hole MH1, the inner wall of the memory film 40, and the stepped portion 11s.

Figure 11B:
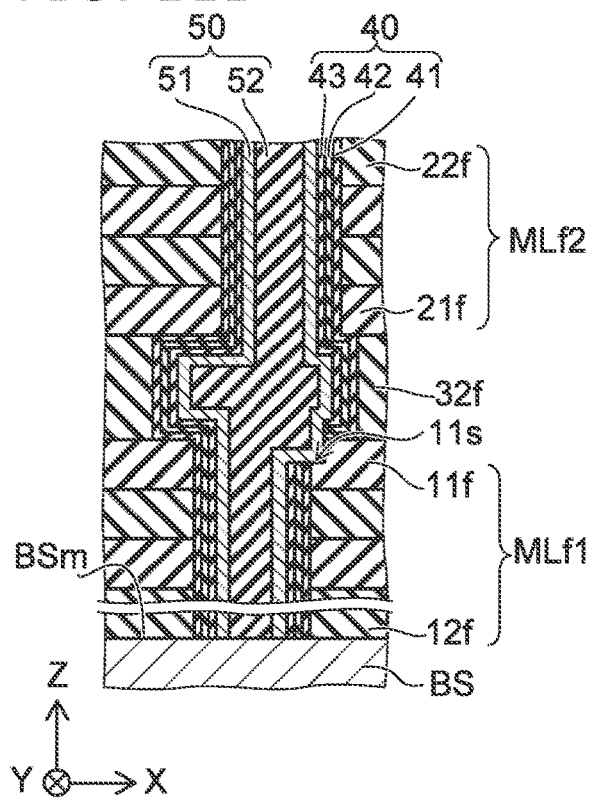

As shown in FIG. 11B, the core insulating film 52 is formed inside the first hole MH1. The first hole MH1 is filled with the core insulating film 52. Thereby, the semiconductor pillar 50 that includes the core insulating film 52 and the semiconductor film 51 is formed inside the first hole MH1.

Figure 11C:
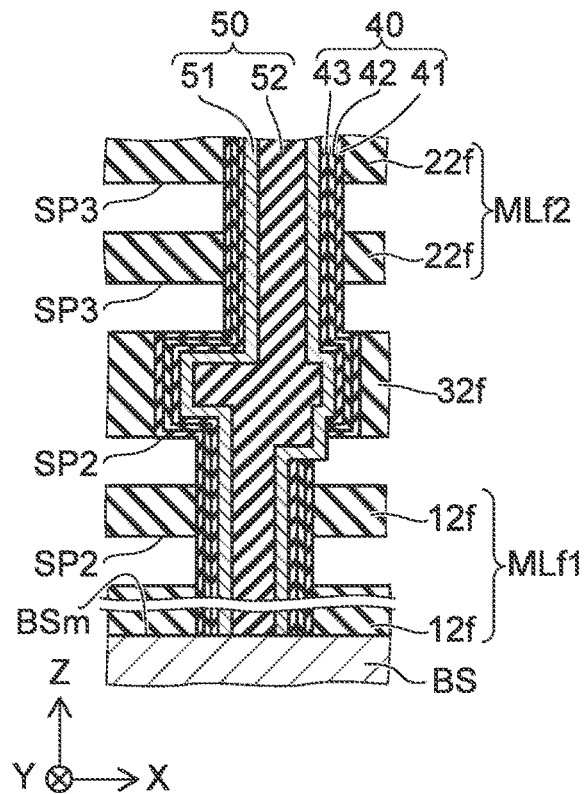
Figure 11D:
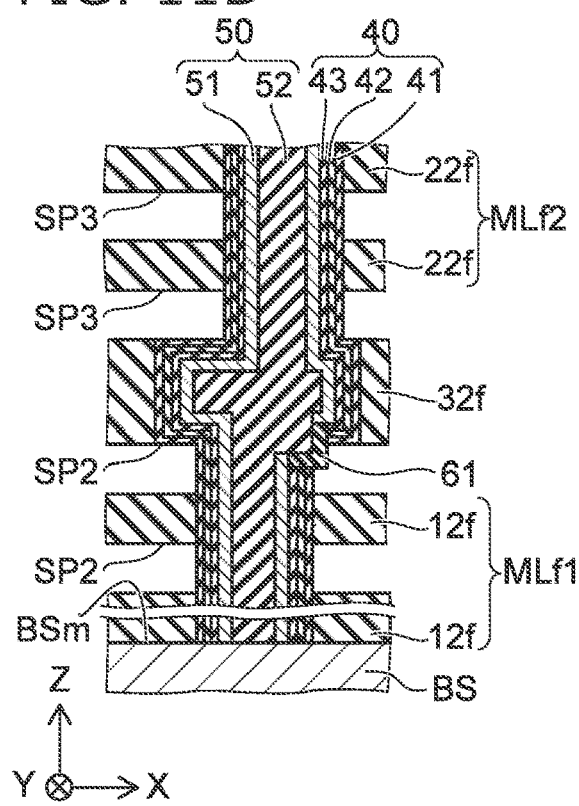

The first films 11f and the second films are removed as shown in FIG. 11C. The second spaces SP2 are formed by removing the first films 11f. The third spaces SP3 are formed by removing the third films 21f. At this time, a portion of the semiconductor film 51 is exposed from the memory film 40 in the second spaces SP2.

The portion of the semiconductor film 51 exposed from the memory film 40 is oxidized via the second spaces SP2. The oxidized portion of the semiconductor film 51 is used as the insulating film 61.

The insulating film 61 may be formed on the inner wall of the first space SP1, the inner wall of the second space SP2 and the inner wall of the third space SP3. In this case, a film including silicon oxide is formed on the inner wall of the first space SP1, the inner wall of the second space SP2 and the inner wall of the third space SP3. Thereby, the insulating film 61 is formed.

Subsequently, conductive layers (the first conductive layers 11, the intermediate conductive layer 31, and the second conductive layers 21) are formed inside the second spaces SP2 and inside the third spaces SP3. Thereby, the semiconductor memory device 130 shown in FIG. 3A is manufactured. In the embodiment, the conductive layer most distal to the base body BS of the conductive layers formed inside the second spaces SP2 corresponds to the intermediate conductive layer 31. The first structure body MLf1 is used as the first stacked body ML1 including the multiple first conductive layers 11 and the multiple first insulating layers 12. The second structure body MLf2 is used as the second stacked body ML2 including the multiple second conductive layers 21 and the multiple second insulating layers 22. In the case where the stepped portion 11s is formed in the first film 11f, the intermediate conductive layer 31 is formed by inheriting the configuration of the stepped portion 11s. In such a case, the intermediate conductive layer 31 includes the stepped portion 31s.

In the embodiment, the insulating film 61 can be formed by omitting the formation of the intermediate film 31f and the removal of the intermediate film 31f. Thereby, the number of manufacturing processes can be reduced.

According to the embodiments described above, for example, a semiconductor memory device and a method for manufacturing the semiconductor memory device can be realized in which the memory capacity per surface area can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A device, comprising:
a base body;
a lower stacked unit provided above the base body, the lower stacked unit including a plurality of lower electrode layers alternately stacked in a stacking direction with a plurality of lower insulating layers therebetween;
an upper stacked unit provided above the lower stacked unit, the upper stacked unit including a plurality of upper electrode layers alternately stacked in the stacking direction with a plurality of upper insulating layers therebetween;
a first intermediate layer provided above the lower stacked unit and below the upper stacked unit;
a lower pillar portion piercing the lower stacked unit in the stacking direction, the lower pillar portion including a lower core insulator part and a lower semiconductor film portion extending inside the lower electrode layers in the stacking direction around an outer circumferential surface of the lower core insulator part;
an upper pillar portion piercing the upper stacked unit in the stacking direction, the upper pillar portion including an upper core insulator part and an upper semiconductor film portion extending inside the upper electrode layers in the stacking direction around an outer circumferential surface of the upper core insulator part, the upper semiconductor film portion being electrically connected with the lower semiconductor film portion;
a first charge storage film provided around an outer circumferential surface of the lower semiconductor film portion inside the lower stacked unit; and
a second charge storage film provided around an outer circumferential surface of the upper semiconductor film portion inside the upper stacked unit,
wherein
a portion of the upper core insulator part overlaps with the lower semiconductor film portion when projected from the stacking direction, a portion of the first charge storage film provided between the lower semiconductor film portion and an uppermost layer of the lower electrode layers is discontinuous with a portion of the second charge storage film provided between the upper semiconductor film portion and a lowermost layer of the upper electrode layers, a thickness of the first intermediate layer is greater than a thickness of the lower insulating layers and a thickness of the upper insulating layers, and the first intermediate layer is insulative.

2. The device according to claim 1, wherein the upper semiconductor film portion is electrically connected with the lower semiconductor film portion via an intermediate semiconductor film portion provided inside the first intermediate layer, the upper core insulator part is integrally formed inside the upper semiconductor film portion and inside the intermediate semiconductor film portion and a width of the upper core insulator part in a first direction perpendicular to the stacking direction is broadening locally at a height corresponding to the first intermediate layer.

3. The device according to claim 2, wherein a locally broadening portion of the upper core insulator part overlaps with the lower semiconductor film portion when projected from the stacking direction.

4. The device according to claim 2, wherein the intermediate semiconductor film portion is bent in the stacking direction inside the first intermediate layer.

5. The device according to claim 1, further comprising:

a second intermediate layer provided between the first intermediate layer and the lower stacked unit.

6. The device according to claim 5, wherein a thickness of the second intermediate layer is greater than a thickness of the lower insulating layers and a thickness of the upper insulating layers.

7. A device, comprising:

a base body;

a lower stacked unit provided above the base body, the lower stacked unit including a plurality of lower electrode layers alternately stacked in a stacking direction with a plurality of lower insulating layers therebetween;

an upper stacked unit provided above the lower stacked unit, the upper stacked unit including a plurality of upper electrode layers alternately stacked in the stacking direction with a plurality of upper insulating layers therebetween;

a first intermediate layer provided above the lower stacked unit and below the upper stacked unit;

a first pillar portion piercing the lower stacked unit in the stacking direction, the first pillar portion including a first semiconductor film portion extending inside the lower electrode layers in the stacking direction;

a second pillar portion piercing the upper stacked unit in the stacking direction, the second pillar portion including a second semiconductor film portion extending inside the upper electrode layers in the stacking direction;

a third pillar portion provided inside the first intermediate layer, the third pillar portion including a third semiconductor film portion continuously connected with the second semiconductor film portion;

a first charge storage film provided around an outer circumferential surface of the first semiconductor film portion inside the lower stacked unit; and a second charge storage film provided around an outer circumferential surface of the second semiconductor film portion inside the upper stacked unit; wherein a core insulator is integrally formed inside the second semiconductor film portion and inside the third semiconductor film portion continuously connected with the second semiconductor film portion and a width of the core insulator in a first direction perpendicular to the stacking direction is broadening locally at a height corresponding to the first intermediate layer, and a portion of the first charge storage film provided between the first semiconductor film portion and an uppermost layer of the lower electrode layers is discontinuous with a portion of the second charge storage film provided between the second semiconductor film portion and a lowermost layer of the upper electrode layers.

8. The device according to claim 7, wherein the width of the core insulator is broadening on both sides in the first direction.

9. The device according to claim 7, wherein the third semiconductor film portion is bent in the stacking direction inside the first intermediate layer.

10. The device according to claim 7, wherein a thickness of the first intermediate layer is greater than a thickness of the lower insulating layers and a thickness of the upper insulating layers.

11. The device according to claim 7, further comprising:

a second intermediate layer provided between the first intermediate layer and the lower stacked unit.

12. The device according to claim 7, wherein the first intermediate layer is insulative.

13. The device according to claim 7, wherein the first charge storage film and the second charge storage film are not provided between the third semiconductor film portion and the first inteii iediate layer.

14. A device, comprising:

a base body;

a lower stacked unit provided above the base body, the lower stacked unit including a plurality of lower electrode layers alternately stacked in a stacking direction with a plurality of lower insulating layers therebetween;

an upper stacked unit provided above the lower stacked unit, the upper stacked unit including a plurality of upper electrode layers alternately stacked in the stacking direction with a plurality of upper insulating layers therebetween;

a first intermediate layer provided above the lower stacked unit and below the upper stacked unit;

a first pillar portion piercing the lower stacked unit in the stacking direction, the first pillar portion including a first semiconductor film portion extending inside the lower electrode layers in the stacking direction;

a second pillar portion piercing the upper stacked unit in the stacking direction, the second pillar portion including a second semiconductor film portion extending inside the upper electrode layers in the stacking direction;

a third pillar portion provided inside the first intermediate layer, the third pillar portion including a third semiconductor film portion provided between the first semiconductor film portion and the second semiconductor film portion;

a first charge storage film provided around an outer circumferential surface of the first semiconductor film portion inside the lower stacked unit; and a second charge storage film provided around an outer circumferential surface of the second semiconductor film portion inside the upper stacked unit; wherein the third semiconductor film portion is bent in the stacking direction inside the first intermediate layer, a portion of the first charge storage film provided between the first semiconductor film portion and an uppermost layer of the lower electrode layers is discontinuous with a portion of the second charge storage film provided between the second semiconductor film portion and a lowermost layer of the upper electrode layers, and the first charge storage film and the second charge storage film are not provided between the third semiconductor film portion and the first intermediate layer.

15. The device according to claim 14, wherein the third pillar portion further includes a core insulator part provided inside the third semiconductor film portion.

16. The device according to claim 15, wherein a portion of the core insulator part overlaps with the first semiconductor film portion when projected from the stacking direction.

17. The device according to claim 14, wherein a thickness of the first intermediate layer is greater than a thickness of the lower insulating layers and a thickness of the upper insulating layers.

18. The device according to claim 14, further comprising: a second intermediate layer provided between the first intermediate layer and the lower stacked unit.

19. The device according to claim 14, wherein the first intermediate layer is insulative.

20. The device according to claim 14, wherein a core insulator is integrally formed inside the second semiconductor film portion and inside the third semiconductor film portion.

* * * * *